(12) United States Patent
Der Minassians et al.

(10) Patent No.: US 12,068,100 B2
(45) Date of Patent: Aug. 20, 2024

(54) EMBEDDED AND DISTRIBUTED INDUCTIVE DEVICES

(71) Applicant: Empower Semiconductor, Inc., Milpitas, CA (US)

(72) Inventors: Artin Der Minassians, Oakland, CA (US); Alexandre Antunes Bezerra, Berkeley, CA (US)

(73) Assignee: Empower Semiconductor, Inc., San Jose, CA (US)

( * ) Notice: Subject to any disclaimer, the term of this patent is extended or adjusted under 35 U.S.C. 154(b) by 377 days.

(21) Appl. No.: 17/390,599

(22) Filed: Jul. 30, 2021

(65) Prior Publication Data

US 2022/0059276 A1 Feb. 24, 2022

Related U.S. Application Data

(60) Provisional application No. 63/067,530, filed on Aug. 19, 2020.

(51) Int. Cl.
| | |
|---|---|
| *H01L 23/498* | (2006.01) |
| *H01F 27/28* | (2006.01) |
| *H01L 23/552* | (2006.01) |
| *H01L 23/58* | (2006.01) |
| *H01F 37/00* | (2006.01) |

(52) U.S. Cl.
CPC ..... *H01F 27/2804* (2013.01); *H01F 27/2885* (2013.01); *H01L 23/49838* (2013.01); *H01L 23/552* (2013.01); *H01L 23/58* (2013.01); *H01F 2027/2809* (2013.01); *H01F 37/00* (2013.01); *H01L 23/49822* (2013.01)

(58) Field of Classification Search
CPC . H01L 23/12–15; H01L 23/498–49894; H01L 23/538–5389; H01F 27/2804; H01F 27/2885; H01F 37/00; H01F 2027/2809; H01F 2017/0073; H01F 2017/008
See application file for complete search history.

(56) References Cited

U.S. PATENT DOCUMENTS

| | | | | |
|---|---|---|---|---|
| 9,515,003 | B1 * | 12/2016 | Fitzgerald | H01L 23/345 |
| 2004/0256133 | A1 * | 12/2004 | Dishongh | H05K 7/1092 |
| | | | | 257/E23.079 |
| 2016/0233153 | A1 * | 8/2016 | Kidwell, Jr. | H01L 21/4857 |
| 2020/0321323 | A1 * | 10/2020 | Himeda | H02M 3/003 |

* cited by examiner

*Primary Examiner* — Tucker J Wright
(74) *Attorney, Agent, or Firm* — Fisher Broyles, LLP

(57) ABSTRACT

An electronic package comprises an integrated circuit (IC) configured to receive a power input signal and to deliver a regulated power output signal. A multilayer electrical routing structure is attached to the IC and is configured to couple the electronic package to an external circuit. The multilayer routing structure has one or more electrical conductors on each of at least two layers which are configured to route the power input signal from the external circuit to the IC and to route the regulated power output signal from the IC to the external circuit. The one or more electrical conductors form an integrated inductive device having a respective portion disposed on each of the at least two layers and the power output signal is coupled to the external circuit through the integrated inductive device.

14 Claims, 12 Drawing Sheets

EMBEDDED AND DISTRIBUTED INDUCTIVE DEVICES

CROSS-REFERENCE TO RELATED APPLICATIONS

This present application claims the benefit of U.S. Provisional application No. 63/067,530, filed on Aug. 19, 2020, entitled "EMBEDDED AND DISTRIBUTED INDUCTIVE DEVICES", the entire contents of which is incorporated herein by reference for all purposes.

BACKGROUND

Currently there are a wide variety of electronic systems that require power management solutions having a more compact geometry to meet customer needs. As the size of power management systems are reduced, space for the corresponding electronic components is commensurately reduced and/or eliminated. New power management systems require new electronic components and/or new methods of implementing electronic components that consume less space in electronic systems.

BRIEF SUMMARY OF THE INVENTION

In some embodiments an electronic package comprises an integrated circuit (IC) configured to receive a power input signal and to deliver a regulated power output signal. A multilayer electrical routing structure is attached to the IC and is configured to couple the electronic package to an external circuit. The multilayer routing structure has one or more electrical conductors on each of at least two layers configured to route the power input signal from the external circuit to the IC and to route the regulated power output signal from the IC to the external circuit. The one or more electrical conductors form an integrated inductive device having a respective portion disposed on each of the at least two layers and wherein the power output signal is coupled to the external circuit through the integrated inductive device. An encapsulant is formed over the IC and at least a portion of the multilayer electrical routing structure.

In some embodiments the integrated inductive device is in a geometric shape of a serpentine structure that includes a first respective portion on a first layer and a second respective portion on a second layer, wherein electrical connections between the first layer and the second layer are formed with one or more electrically conductive vias. In various embodiments the integrated inductive device is in a geometric shape of a solenoid coil. In some embodiments the integrated inductive device in the shape of a solenoid coil includes a first portion of a winding on a first layer of the multilayer routing structure and a second portion of a winding on a different layer of the multilayer routing structure. In various embodiments each of the first portion and the second portion are one-half of a turn or greater.

In some embodiments the first winding on the first layer is adjacent the second winding on a second layer, wherein the multilayer routing structure includes a top layer and a bottom layer between which are positioned the first layer and the second layer, and wherein each of the top layer and the bottom layer include an electrically conductive continuous sheet positioned across a region of the first and the second windings. In various embodiments the first winding on the first layer is adjacent the second winding on a second layer and wherein the multilayer routing structure includes a top layer and a bottom layer between which are positioned the first layer and the second layer. Each of the top layer and the bottom layer include sequential strips of electrically conductive material having a respective gap in-between each adjacent strip.

In some embodiments the first winding on the first layer is adjacent the second winding on a second layer. The multilayer routing structure includes a top layer and a bottom layer between which are positioned the first layer and the second layer, and wherein each of the top layer and the bottom layer include sequential first strips of electrically conductive material extending in a first direction and having a respective gap in-between each adjacent first strip and sequential second strips of electrically conductive material extending in a second direction and having a respective gap in-between each adjacent second strip, and wherein the first direction is orthogonal to the second direction.

In some embodiments the first and second windings of the vertical solenoid coil are arranged to conduct current in a clockwise direction. The electronic package includes an adjacent vertical solenoid coil including a third winding positioned on the first layer and a fourth winding positioned on the different layer wherein the third and fourth windings of the adjacent vertical solenoid coil are arranged to conduct current in a counterclockwise direction. In various embodiments the electronic package further comprises a row of a plurality of adjacent electrically conductive vias that extend from at least the first layer to the different layer and are arranged in a pattern that encompasses the vertical solenoid coil.

In some embodiments the integrated inductive device includes a first respective portion on a second layer and a second respective portion on a third layer and wherein a first layer and a fourth layer each include electrically conductive continuous sheets extending across the first and the second windings to shield electromagnetic energy generated by the inductive device. In various embodiments the integrated inductive device includes a first respective portion on a second layer and a second respective portion on a third layer, wherein a first layer and a fourth layer each include sequential strips of electrically conductive material having a respective gap in-between each adjacent strip to shield electromagnetic energy generated by the inductive device.

In some embodiments an electronic package comprises a substrate including a plurality of layers positioned between a top surface and a bottom surface, the bottom surface including one or more electrical contacts arranged to be electrically coupled to an external circuit. A silicon-based power management power integrated circuit (PMIC) is electrically coupled to the top surface of the substrate. An inductor in a geometric shape of a solenoid coil has one or more turns, the solenoid coil is formed within the substrate such that at least a first portion of a first turn is formed on a first layer of the plurality of layers and at least a second portion of the first turn is formed on a second layer of the plurality of layers. In various embodiments the at least a first portion of the first turn is electrically coupled to the at least a second portion of the first turn with an electrically conductive via.

In some embodiments a central axis of the solenoid coil is oriented perpendicular to the top surface of the substrate. In various embodiments a central axis of the solenoid coil is oriented parallel to the top surface of the substrate. In some embodiments the first layer and the second layer are positioned between an upper layer and a lower layer, wherein the upper layer and the lower layer each include an electrically conductive continuous sheet extending across a region of the at least a first portion of the first turn and the at least a second portion of the first turn such that the inductor is substantially positioned between the continuous sheets.

In some embodiments the first layer and the second layer are positioned between an upper layer and a lower layer, wherein the upper layer and the lower layer each include a shielding region having sequential strips of electrically conductive material having a respective gap in-between each adjacent strip wherein each shielding region extends across a region of the at least a first portion of the first turn and the at least a second portion of the first turn such that the inductor is substantially positioned between the shielding regions. In various embodiments the inductor is a first inductor and one or more turns conduct electrical current in a clockwise direction, wherein the electronic package includes a second inductor positioned adjacent the first inductor and wherein the second inductor includes at least two turns and conducts electrical current in a counterclockwise direction. In various embodiments the electronic package further comprises a row of a plurality of adjacent electrically conductive vias that extend from the top surface to the bottom surface and are arranged in a pattern that encompasses the solenoid coil.

DETAILED DESCRIPTION

Techniques disclosed herein relate generally to methods of embedding and distributing inductive components within a power management system. More specifically, techniques disclosed herein relate to inductive devices that are embedded in integrated circuit (IC) packaging and/or are distributed between the IC package and a circuit board to which the package is attached. Various inventive embodiments are described herein, including methods, processes, systems, devices, and the like.

In order to better appreciate the features and aspects of embedded and/or distributed inductive devices according to the present disclosure, further context for the disclosure is provided in the following section by discussing one particular implementation of an electronic BGA package according to embodiments of the present disclosure. These embodiments are for example only and other embodiments can be employed in other electronic packages such as, but not limited to quad-flat no lead (QFN), small-outline IC (SOIC), sealed chip on-board (SCOB), multi-chip modules (MCM), ceramic modules, etc.

Figure 1:
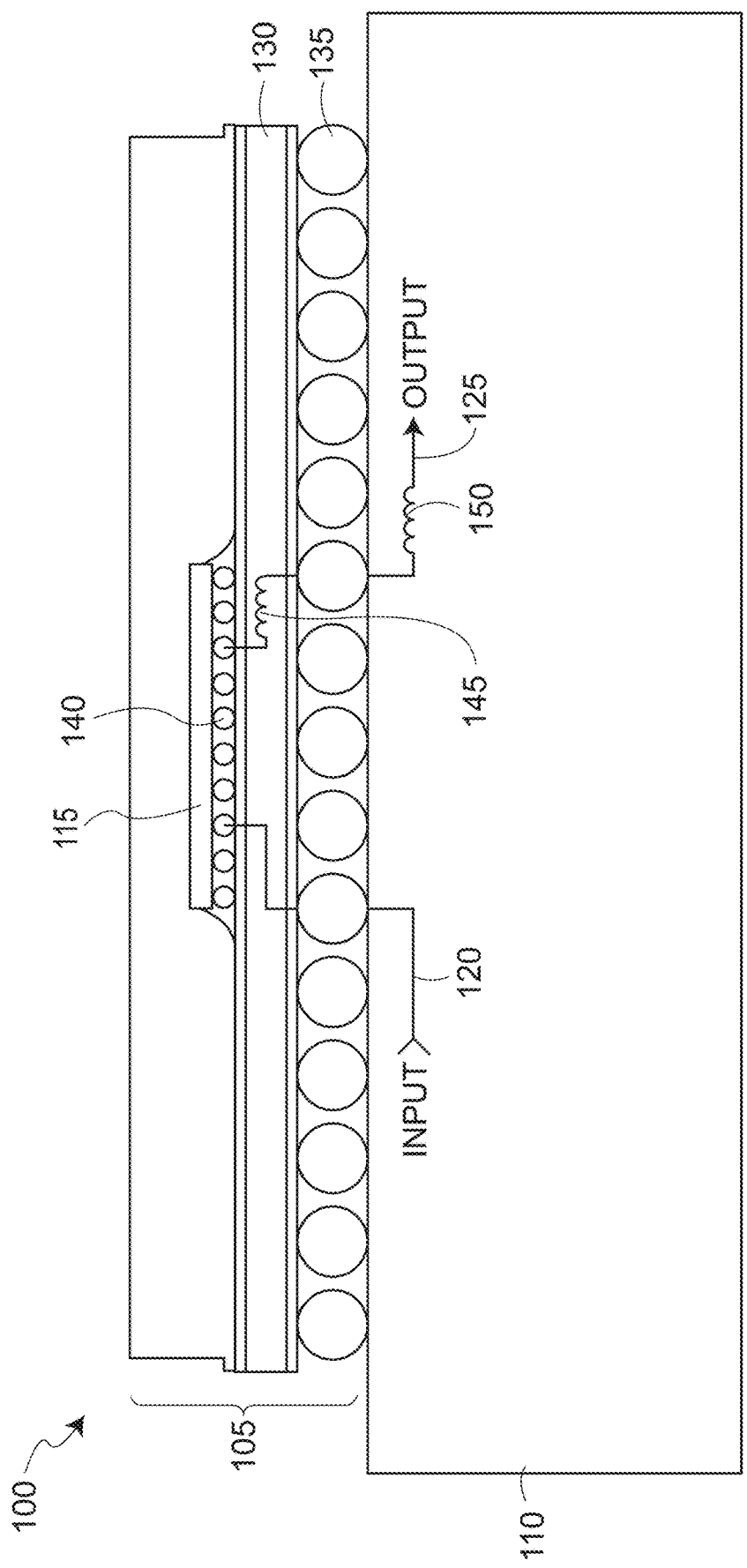
FIG. 1 depicts an illustrative rendering of an electronic assembly, according to some embodiments of the disclosure.

FIG. 1 depicts an illustrative rendering of an electronic assembly 100, according to some embodiments of the disclosure. As shown in FIG. 1, electronic assembly 100 includes an organic ball-grid array (BGA) package 105 attached to a printed circuit board (PCB) 110. BGA package 105 can include one or more integrated circuits (ICs) 115, which in this particular embodiment, are power management integrated circuits (PMICs) configured to receive a power input signal 120 and to deliver a regulated power output signal 125 to a load (not shown in FIG. 1). IC's 115 can be silicon-based or any other suitable semiconductor material, including but not limited to, GaN or SiC and attached to a substrate 130 which can be any type of suitable electrical routing structure including, but not limited to, an organic printed circuit board, a ceramic-based substrate or an insert-molded leadframe assembly.

BGA package 105 is attached to PCB 110 using a plurality of spheres 135. In some embodiments spheres 135 can be solder spheres (also known as solder balls) that can be composed of any type of solder, including but not limited to, alloys known as SAC305, SAC405, tin/lead alloys or any other suitable solder alloy. In some embodiments spheres 135 can be metallic spheres coated with a solder or other alloy. In yet further embodiments BGA package 105 can be a different type of electronic package such as, but not limited to a QFN, SOIC, DIP, etc. and can be attached to PCB 110 using other suitable interconnect structures such as, but not limited to, solder pads, a land-grid array or copper pads that may be terminated in one or more metals.

As further shown in FIG. 1, power output signal 125 can be routed out of IC 115, through one or more IC interconnects 140 (illustrated as spheres in FIG. 1) and into substrate 130. Within substrate 130 one or more first embedded inductive devices 145 can be used to filter and/or condition power output signal 125. Power output signal 125 can be routed out of substrate 130 to PCB 110 through one or more spheres 135. In some embodiments power output signal can then be routed through one or more second embedded inductive devices 150 can be used to filter and/or condition the power output signal. Thus, in this embodiment inductive devices are embedded in both package substrate 130 and within external PCB 110. First and second embedded inductive devices 145, 150, respectively, work in conjunction with each other to filter and/or condition power output signal 125. More specifically, in one embodiment power output signal 125 has ripple (e.g., a variation in voltage and/or current) that must be attenuated before reaching the load, and first and second embedded inductive devices 145, 150, respectively, assist in reducing the ripple to acceptable levels.

In some embodiments first and second embedded inductive devices 145, 150, respectively, can be of different geometries, sizes and/or performance characteristics while in other embodiments they can be of similar geometries, sizes and/or performance characteristics. In yet further embodiments first and second embedded inductive devices 145, 150, respectively, can be surrounded by one or more shielding structures to minimize electromagnetic noise emissions, as described in more detail below.

In some embodiments PCB 110 can by any type of electronic routing structure and can include one or more layers of dielectric material and one or more layers of metal for electrical routing of signals. In various embodiments the dielectric material can be, but is not limited to, polyimide, fiberglass FR4, fiberglass BT, ceramic, polymer, silicon or any other suitable dielectric material. In some embodiments an encapsulant is formed over at least a portion of IC 115 and at least a portion of substrate 130.

Figure 2:
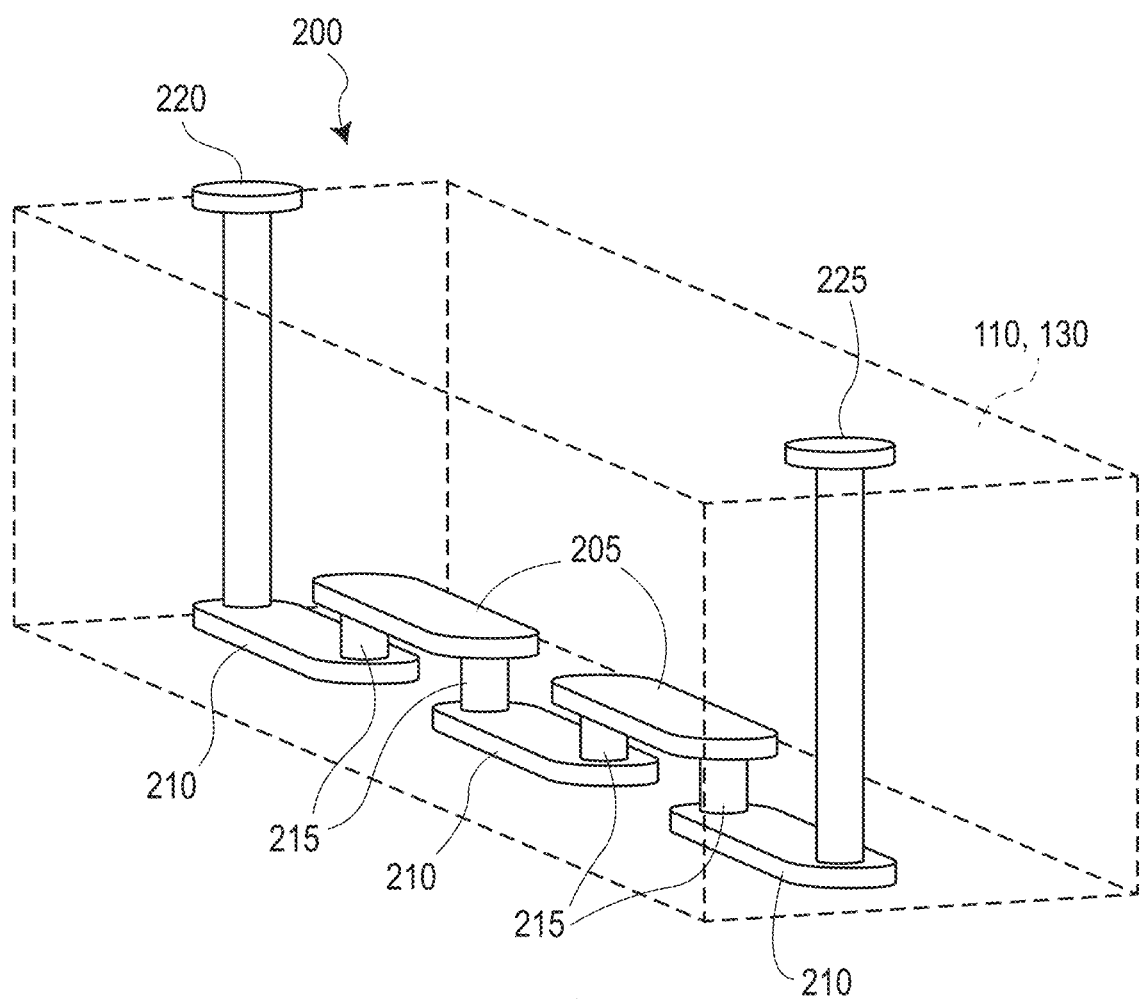
FIG. 2 illustrates a 3-dimensional serpentine inductive device that can be employed in a substrate and/or PCB of FIG. 1.

FIG. 2 illustrates a 3-dimensional serpentine inductive device that can be employed in substrate 130 and/or PCB 110 shown in FIG. 1 and partially represented in FIG. 2 by dashed lines, according to embodiments of the disclosure. As shown in FIG. 2, inductive device 200 is made up of a series of first traces 205 and second traces 210 that are positioned on alternating layers of substrate 130 and/or PCB 110. First and second traces 210, 215, respectively, are interconnected with vias 215 creating a serpentine shape that extends between an input terminal 220 and an output terminal 225. More specifically first traces 205 are within a first layer that is arranged above a second layer within which second traces 210 are formed. The first and second layers may be adjacent one another or they can be separated by one or more intervening layers of substrate 130 and/or PCB 110.

In one embodiment, first and second traces 205, 215, respectively, can be strips of copper embedded within a circuit board. In this embodiment, first and second traces 205, 215, respectively, are aligned in a linear arrangement. Vias 215 can form electrically conductive interconnect structures from one layer to another layer. A length and width of first and second traces, 205, 215, respectively, along with a size and geometry of vias 215 can be used to provide a predetermined inductance for BGA package 105 (see FIG. 1) to reduce ripple on power output signal 125 to acceptable levels. In some embodiments substrate 130 and/or PCB 110 may contain one or more 3-dimensional serpentine inductive devices 200. In some embodiments a 2-dimensional serpentine inductive device can be used which can be in the form of a trace on a circuit board layer that follows a serpentine pattern.

As appreciated by one of skill in the art having the benefit of this application, any of the embodiments described herein can employ parallel traces to reduce resistive losses in the inductive device. More specifically, often circuit boards have many layers and instead of an electrical conductor being only on one layer, the electrical conductor can be split between two or more layers where electrical conductor on each layer are connected in parallel using one or more electrically conductive vias.

Figure 3:
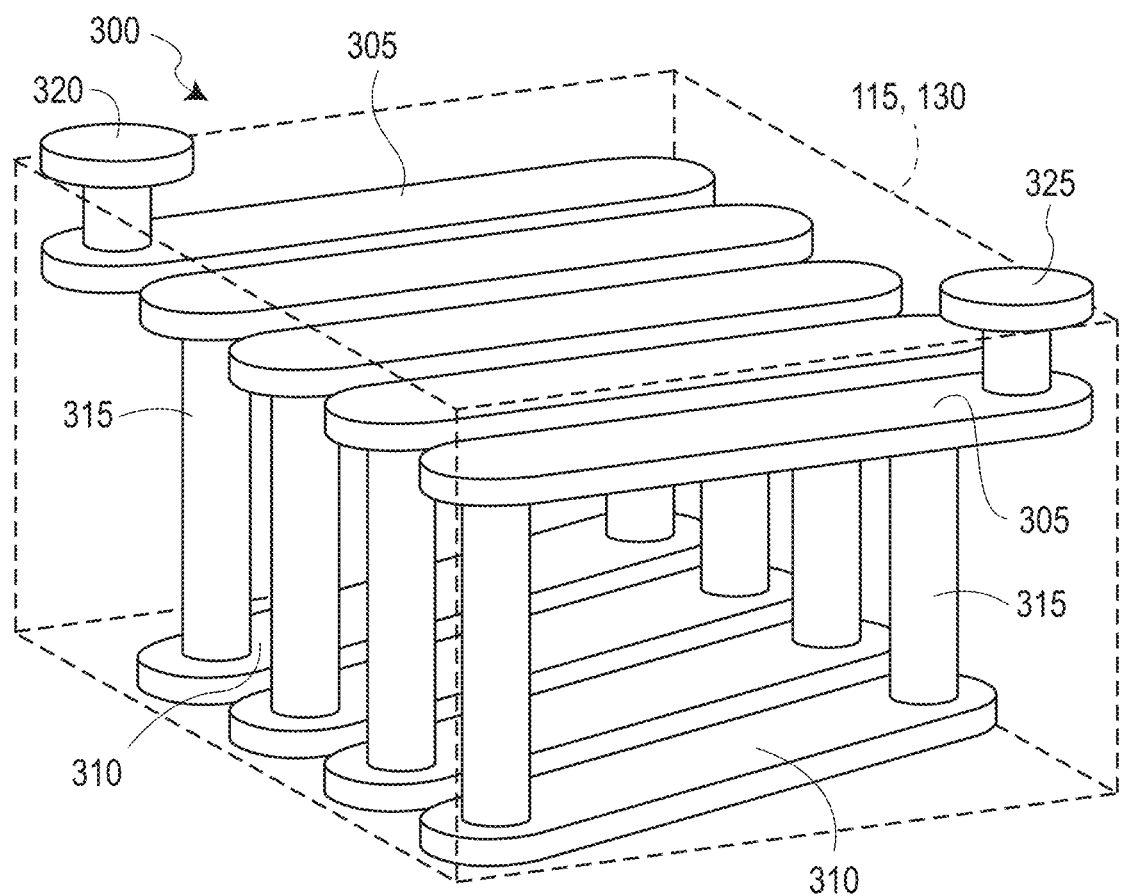
FIG. 3 illustrates a 3-dimensional lateral-axis solenoid inductive device that can be employed in a substrate and/or PCB of FIG. 1.

FIG. 3 illustrates a 3-dimensional lateral-axis solenoid inductive device that can be employed in substrate 130 and/or PCB 110 shown in FIG. 1 and partially represented in FIG. 3 by dashed lines, according to embodiments of the disclosure. As shown in FIG. 3, inductive device 300 is made up of a series of first traces 305 and second traces 310 that are positioned on separate layers. First and second traces 305, 310, respectively, are interconnected with vias 315 forming a continuous conductor extending between an input terminal 320 and an output terminal 325. More specifically first traces 305 are on a first layer that is positioned above a second layer within which second traces 310 are formed. The first and second layers may be adjacent one another or they can be separated by one or more intervening layers within substrate 130 and/or PCB 110.

In one embodiment first and second traces 305, 310, respectively, are strips of copper embedded within substrate 130 and/or PCB 110. In this embodiment first and second traces 305, 310, respectively, are arranged such that the first traces are parallel and adjacent each other on the first layer and the second traces are parallel and adjacent each other on the second layer. Vias 315 can form electrically conductive interconnect structures that extend from layer to layer. A length and width of first and second traces, 305, 310, respectively, along with a size and geometry of vias 315 can be used to provide a predetermined inductance for BGA package 105 (see FIG. 1) to reduce ripple on power output signal 125 to acceptable levels. In some embodiments substrate 130 and/or PCB 110 may contain one or more 3-dimensional lateral-axis solenoid inductive devices 300.

In some embodiments an inductive device 300 is in a geometric shape of a solenoid coil having at least two turns. Other embodiments may have a lesser or a greater number of turns. Inductive device 300 is formed within the substrate such that at least a first portion of a first turn is formed on a first layer of the circuit board and at least a second portion of the first turn is formed on a second layer of the substrate 130. Inductive device 300 includes a central axis of the solenoid coil (e.g., that extends through a center of each turn of the inductive device) such that the central axis is oriented parallel to the top surface of the substrate 130. In an alternative embodiment one or more portions of inductive device 300 can be formed within PCB 110.

Figure 4:
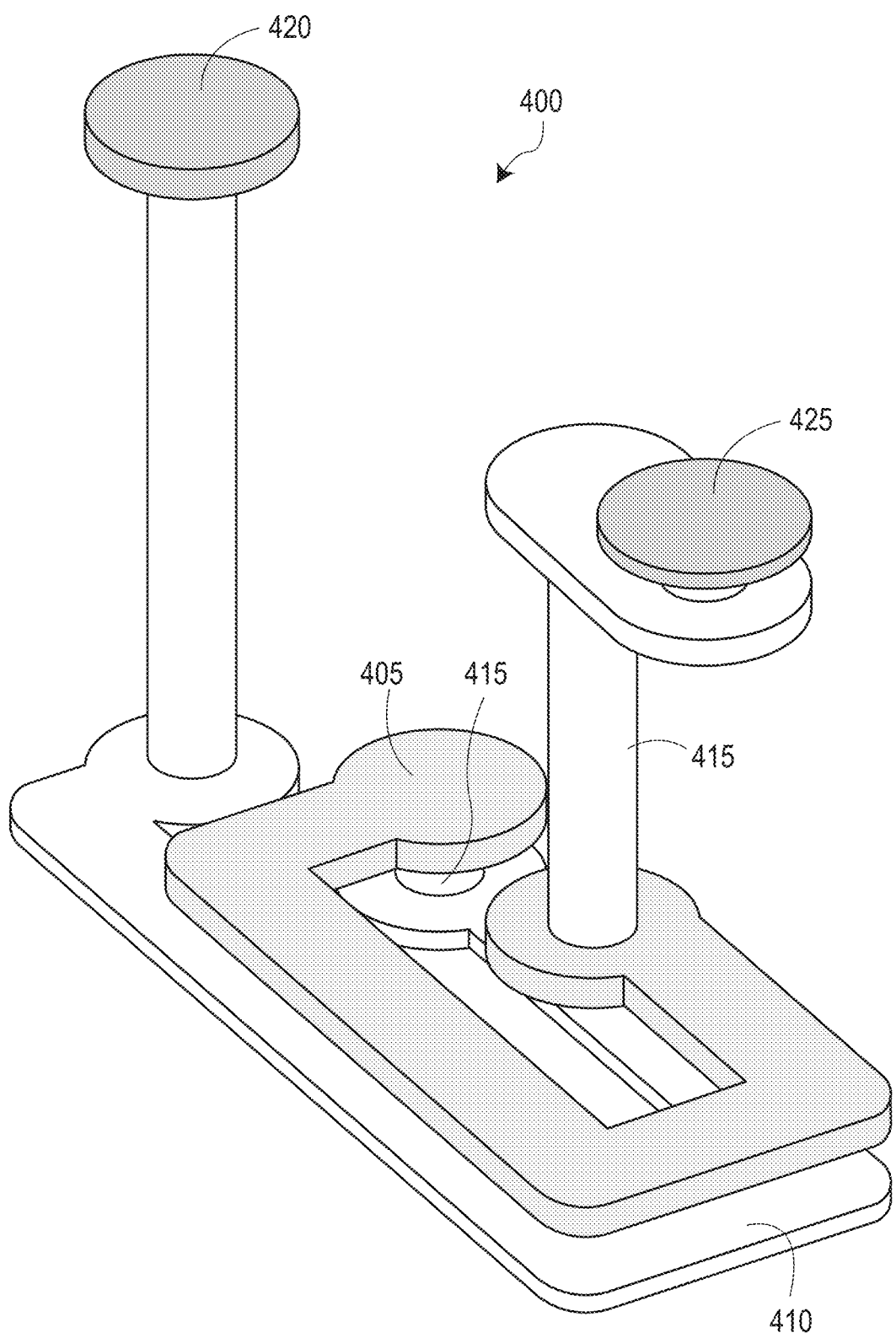
FIG. 4 illustrates a 3-dimensional vertical-axis solenoid inductive device that can be employed in a substrate and/or PCB of FIG. 1.

FIG. 4 illustrates a 3-dimensional vertical-axis solenoid inductive device that can be employed in substrate 130 and/or PCB 110 shown in FIG. 1 and partially represented in FIG. 4, according to embodiments of the disclosure. As shown in FIG. 4, inductive device 400 is made up of a series of first traces 405 positioned on a first layer substrate 130 and/or PCB 110 and second traces 410 that are positioned on a second layer of the substrate and/or the PCB. First and second traces 405, 410, respectively, are interconnected with one or more vias 415 forming a continuous conductor extending between an input terminal 420 and an output terminal 425. More specifically first trace 405 is on a first layer that is positioned above a second layer within which second trace 410 is formed. In some embodiments, the first and second layers may be adjacent one another while in other embodiments they can be separated by one or more intervening layers.

As appreciated by one of skill in the art having the benefit of this disclosure, inductive device 400 can have any number of turns which can be distributed across any number of layers. In some embodiments only half a turn of each winding is formed on a particular layer while in other embodiments each layer may include three-quarters of a turn or more. In further embodiments a first portion of a first turn can be on a first layer and a second portion of the first turn can be on a second layer. Other suitable combinations of layers and turn configurations are within the scope of this disclosure.

In one embodiment first and second traces 405, 410, respectively, are strips of copper embedded within substrate 130 and/or PCB 110. In this embodiment first trace 405 a forms at least a first partial coil and second trace 410, forms a second partial coil where the first and second partial coils are at least partially overlapping (e.g., in a vertical arrangement). Vias 415 can form electrically conductive interconnect structures that extend layer to layer to connect first trace 405 to second trace 410. A length and width of first and second traces, 405, 410, respectively, along with a size and geometry of vias 415 can be used to provide a predetermined inductance for BGA package 105 (see FIG. 1) to reduce ripple on power output signal 125 to acceptable levels. In some embodiments substrate 130 and/or PCB 110 may contain one or more 3-dimensional vertical-axis solenoid inductive devices.

In some embodiments an inductive device 400 is in a geometric shape of a solenoid coil having at least two turns. Inductive device 400 is formed within the substrate such that at least a first portion of a first turn is formed on a first layer of the circuit board and at least a second portion of the first turn is formed on a second layer of the circuit board. Inductive device 400 includes a central axis of the solenoid coil (e.g., that extends through a center of each turn of the inductive device) such that the central axis is oriented perpendicular to the top surface of the substrate. As described above, each trace can be separated into a plurality of parallel traces on one or more layers to reduce resistive losses.

Figure 5:
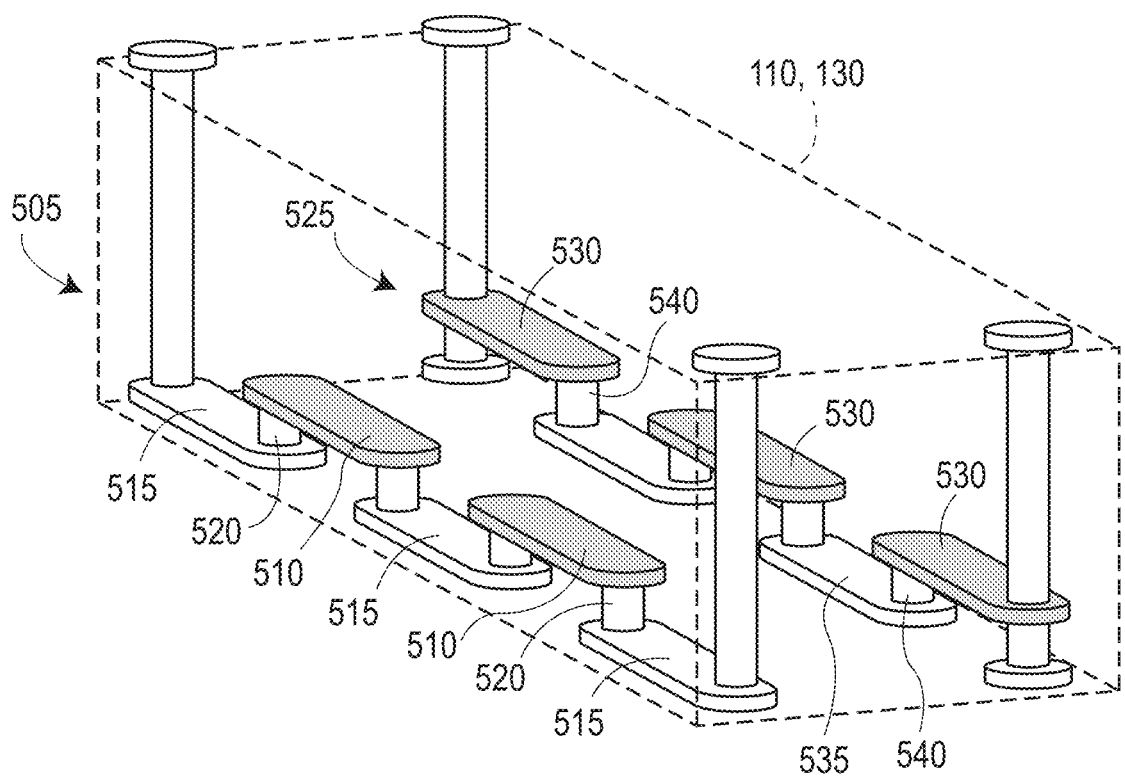
FIG. 5 illustrates a pair of 3-dimensional serpentine inductive devices that can be employed in a substrate and/or PCB of FIG. 1.

FIG. 5 illustrates a pair of 3-dimensional serpentine inductive devices that can be employed in substrate 130 and/or PCB 110 shown in FIG. 1 and partially represented in FIG. 5 by dashed lines, according to embodiments of the disclosure. As shown in FIG. 5, first inductive device 505 is made up of a series of first traces 510 positioned on a first layer and second traces 515 that are positioned on a second layer where the first and second traces are interconnected with one or more first vias 520. Similarly, second inductive device 525 is made up of a series of third traces 530 positioned on the first layer and fourth traces 535 that are positioned on the second layer where the third and fourth traces are interconnected with one or more second vias 540. In this embodiment the traces are staggered to increase the physical separation between first inductive device 505 and second inductive device 525, which decreases mutual inductance between the two inductive devices. In further embodiments, to increase mutual inductance the physical separation between first inductive device 505 and second inductive device 525 can be reduced.

More specifically in this embodiment first and second traces 510, 515, respectively alternate in an opposite pattern as compared to second and third traces 530, 535 respectively, such that when 510 first trace is on the first layer, second trace 530 is on the second layer and when first trace 510 is on the second layer, second trace 530 is on the first layer. The first and second layers may be adjacent one another or they can be separated by one or more intervening layers. In one embodiment, traces 510, 515, 530, 535 are strips of copper embedded within substrate 130 and/or PCB 110. In further embodiments, mutual inductance between first and second inductive devices 505, 525, respectively, can be further reduced by increasing horizontal separation between the devices.

Figure 6:
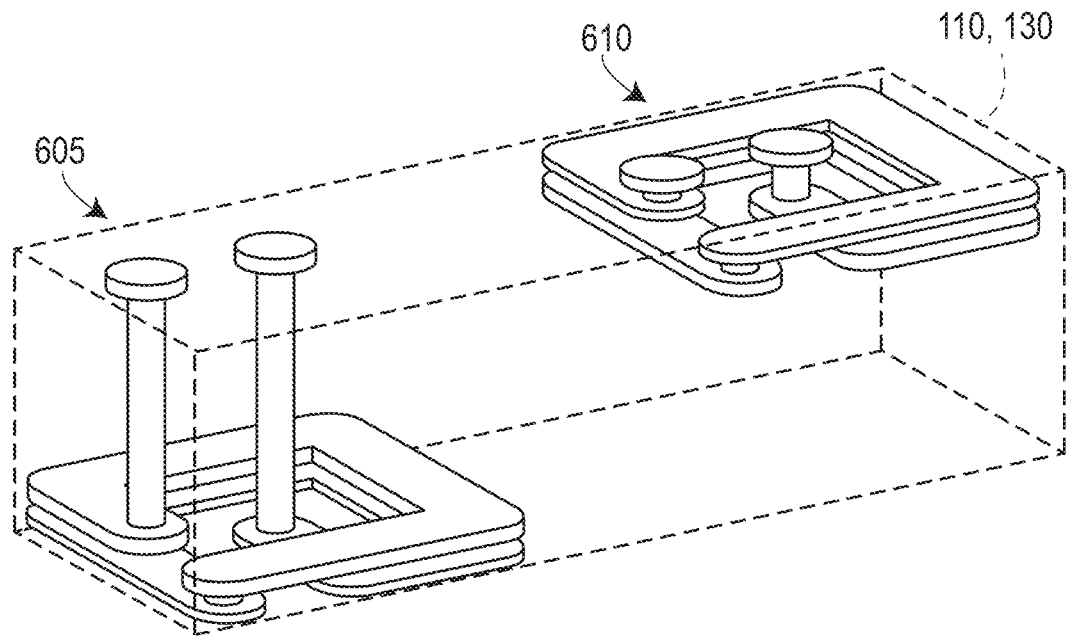
FIG. 6 illustrates a pair of 3-dimensional vertical-axis solenoid inductive devices that can be employed in a substrate and/or PCB of FIG. 1.

FIG. 6 illustrates a pair of 3-dimensional vertical-axis solenoid inductive devices that can be employed in substrate 130 and/or PCB 110 shown in FIG. 1 and partially represented in FIG. 6 by dashed lines, according to embodiments of the disclosure. As shown in FIG. 6, first and second vertical axis solenoid inductive devices 605, 610 respectively, that are similar to vertical axis solenoid device 400 illustrated in FIG. 4 are shown. However, in this embodiment first vertical axis solenoid inductive device 605 is formed on a lower portion of substrate 130 and/or PCB 110 and second vertical axis solenoid inductive device 610 is formed on an upper portion of the substrate and/or the PCB. More specifically, in this embodiment the vertical location of the solenoid coils are staggered between at least two different layers to increase the physical separation between first inductive device 605 and second inductive device 610, which decreases the mutual inductance between the two inductive devices. In further embodiments, mutual inductance between first and second inductive devices 605, 610, respectively, can be further reduced by increasing horizontal separation between the devices.

Figure 7:
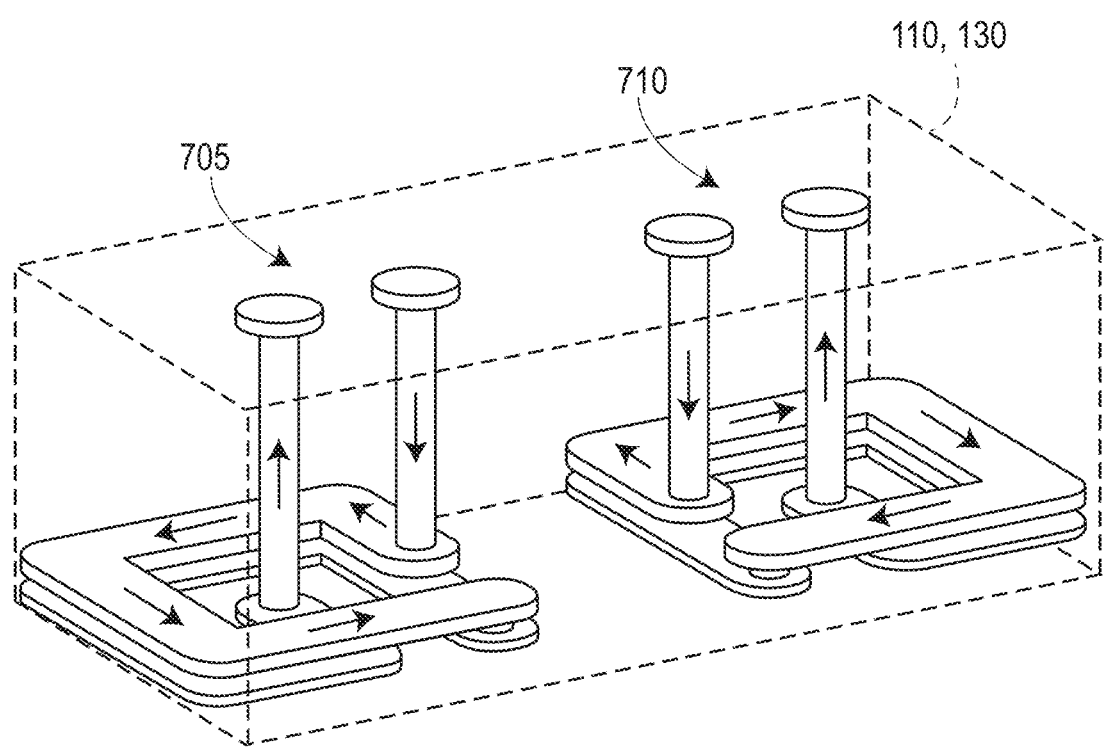
FIG. 7 illustrates a pair of 3-dimensional vertical-axis solenoid inductive devices that can be employed in a substrate and/or PCB of FIG. 1.

FIG. 7 illustrates a pair of 3-dimensional vertical-axis solenoid inductive devices that can be employed in substrate 130 and/or PCB 110 shown in FIG. 1 and partially represented in FIG. 7 by dashed lines, according to embodiments of the disclosure. As shown in FIG. 7, first and second vertical axis solenoid inductive devices 705, 710 respectively, that are similar to the vertical axis solenoid devices illustrated in FIG. 6 are shown, however in this embodiment a winding direction, or current flow, of first inductive device 705 is counter-clockwise and the winding direction of second inductive device 710 is clockwise. The opposite winding directions can be used to change the orientation of the magnetic fields and further reduce the mutual inductance between first and second inductive devices 705, 710, respectively. In some embodiments a combination of opposite winding directions and increased separation (as described and shown in FIG. 6) can be used in conjunction to further reduce mutual inductance.

Figure 8:
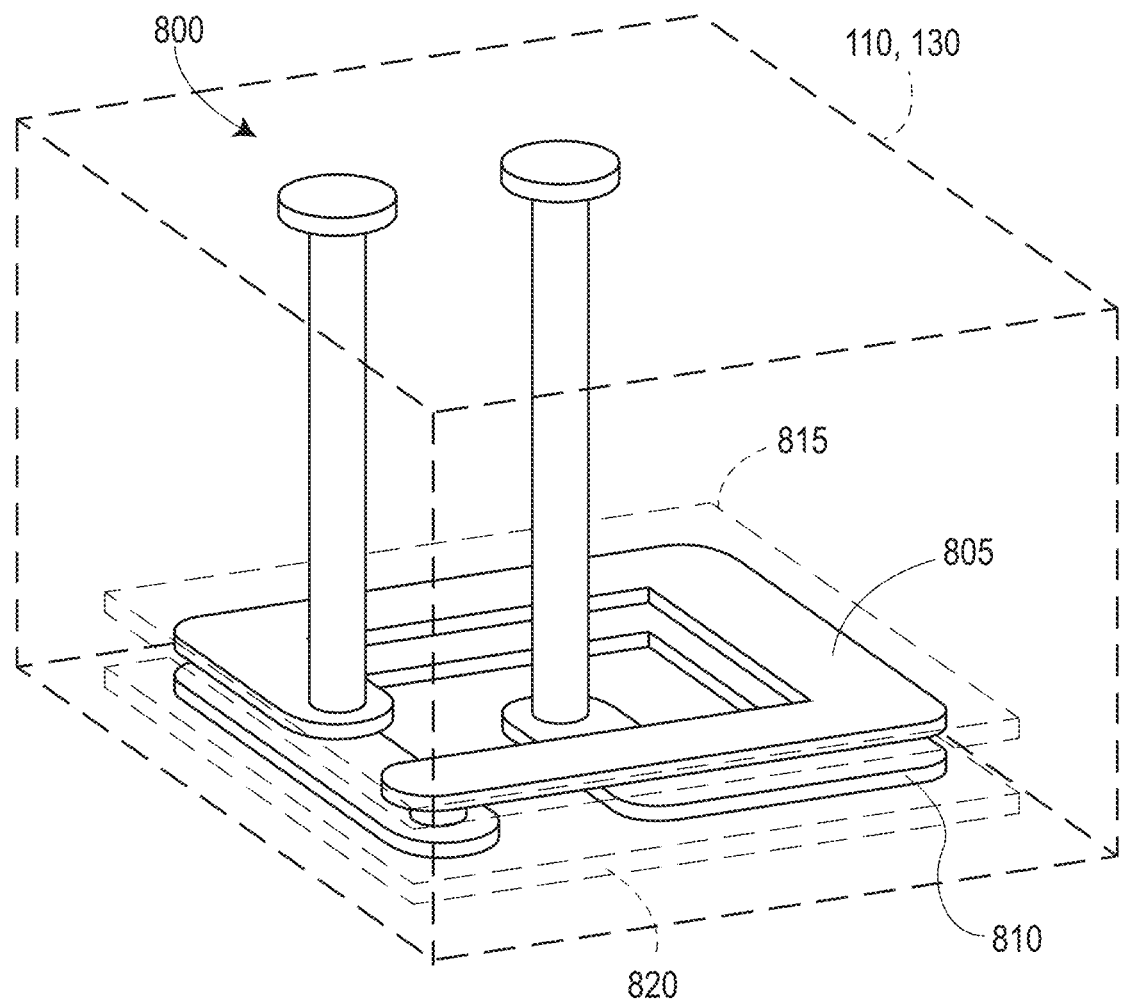
FIG. 8 illustrates an isometric illustration of a 3-dimensional vertical-axis solenoid inductive device that can be employed in a substrate and/or PCB of FIG. 1.

FIG. 8 illustrates an isometric illustration of a 3-dimensional vertical-axis solenoid inductive device that can be employed in substrate 130 and/or PCB 110 shown in FIG. 1 and partially represented in FIG. 8 by dashed lines, according to embodiments of the disclosure. Inductive device 800 is similar to the other vertical-axis solenoid inductive devices shown in FIGS. 4, 6 and 7, however in this embodiment first and second coils 805, 810, respectively, are positioned between a first conductive layer 815 and a second conductive layer 820 of substrate 130 and/or PCB 110. More specifically in this embodiment first conductive layer 815 can be a layer of continuous metal that is positioned above first coil 805 and extends across the physical extents of first and/or second coils 805, 810, respectively. Similarly, second conductive layer 820 can be positioned below second coil 810 and extends across the physical extents of first and/or second coils 805, 810, respectively. In some embodiments conductive layers 815, 820 can extend beyond the extents of the coils, which may provide additional shielding.

In some embodiments first and second conductive layers 815, 820, respectively, can be coupled to a ground potential and can function as electromagnetic interference shields that attenuate electromagnetic noise generated by inductive device 800. More specifically, in some embodiments an operating frequency of the inductive device can be between 1 MHz and 300 MHz which may cause interference with adjacent IC's and/or signals such as, for example, a pulse-width modulated (PWM) drive signal, thus attenuation of electromagnetic energy in this frequency range may be needed for effective operation of the power management circuit. In further embodiments first and second conductive layers 815, 820, respectively, can be left electrically floating and/or are coupled to a different voltage potential than ground.

Figure 9:
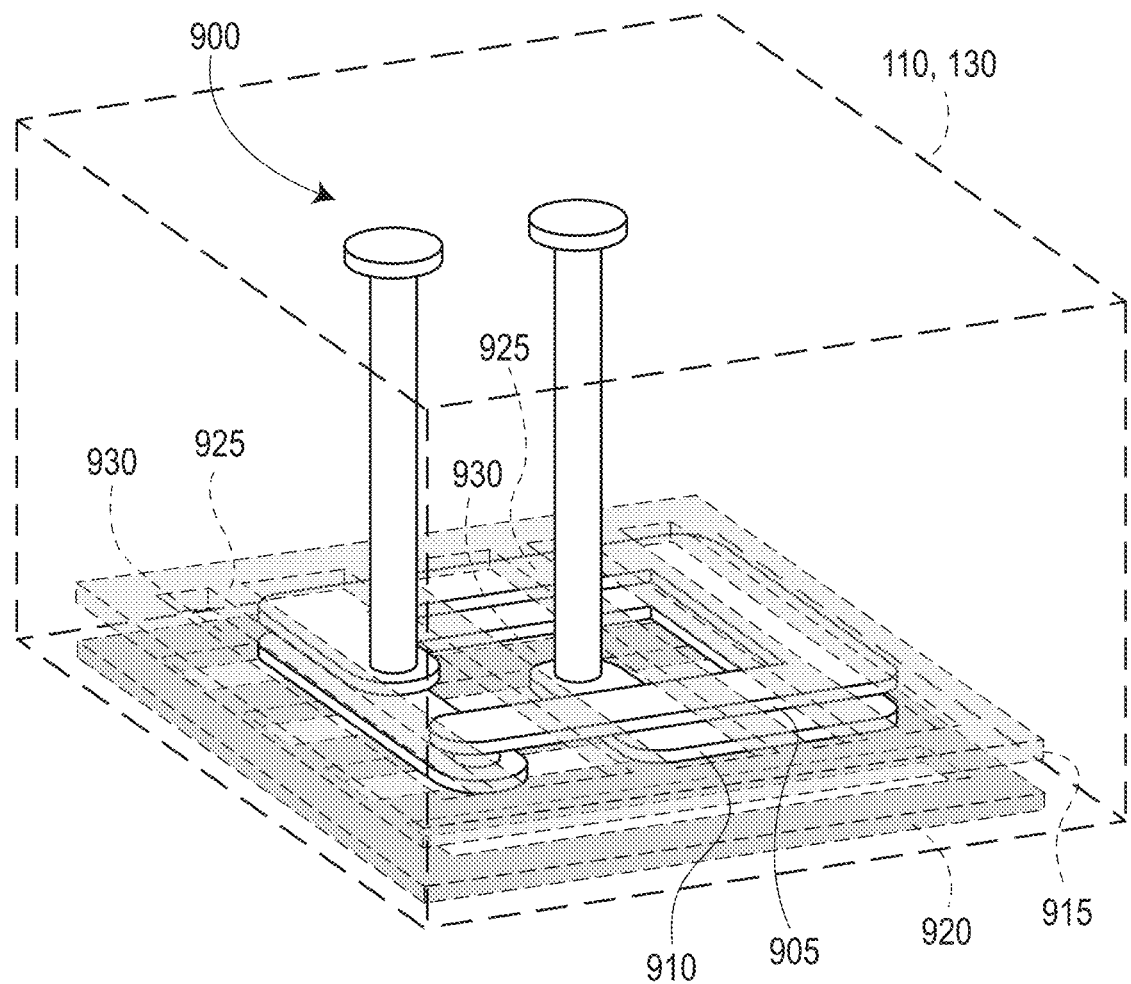
FIG. 9 illustrates a 3-dimensional vertical-axis solenoid inductive device that can be employed in a substrate and/or PCB of FIG. 1.

FIG. 9 illustrates a 3-dimensional vertical-axis solenoid inductive device that can be employed in substrate 130 and/or PCB 110 shown in FIG. 1 and partially represented in FIG. 9 by dashed lines, according to embodiments of the disclosure. Inductive device 900 may be similar to the other vertical-axis solenoid inductive devices shown in FIGS. 4 and 6-8, however in this embodiment first and second conductive layers 915, 920, respectively, each include sequential strips of electrically conductive material with gaps disposed between adjacent strips.

More specifically, first conductive layer 915 has first strips 925 of electrically conductive material arranged in a front-back orientation (as shown in FIG. 9) and second conducive layer 920 has second strips 930 arranged in a left-right orientation (as shown in FIG. 9). In other embodiments first and second conductive layers 915, 920, respectively, can use any orientation of conductive strips.

In some embodiments first and second conductive layers 915, 920, respectively can be coupled to a ground potential and act as electromagnetic interference shields that attenuate electromagnetic noise generated by inductive device 900. In further embodiments first and second conductive layers 915, 920, respectively, can be left electrically floating and/or are coupled to a different voltage potential than ground.

In some embodiments a width of first and/or second strips 925, 930, respectively and/or gaps there between can be optimized to balance attenuation of electromagnetic noise generated by inductive device 900 with the losses in the inductive device associated with the proximity of first and second conductive layers 915, 920, respectively to the inductive device. More specifically, the gaps in the shield may reduce the AC losses in inductive device 900, however the gaps may also simultaneously decrease the efficacy of the electromagnetic shielding.

Figure 10:
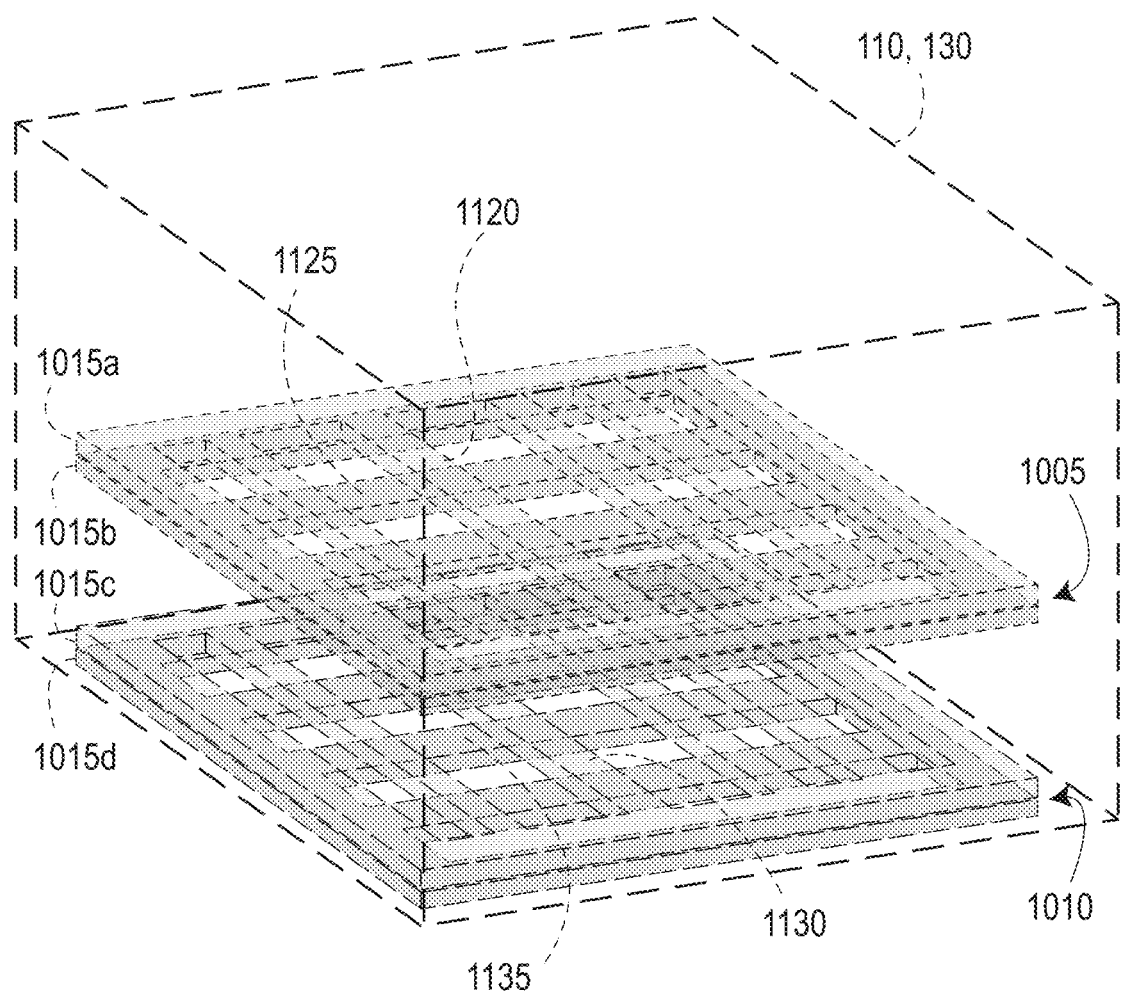
FIG. 10 illustrates an embodiment that is similar to the inductive device shown in FIG. 9, however in this embodiment the solenoid coils are not shown and the first and second conductive layers shown in FIG. 9 are replaced with dual first conductive layers and dual second conductive layers.

FIG. 10 illustrates an embodiment that is similar to the inductive device shown in FIG. 9, however in this embodiment the solenoid coils are not shown in this figure for clarity and the first and second conductive layers of FIG. 9 are replaced with dual first conductive layers 1005, and dual second conductive layers 1010. More specifically, as shown in FIG. 10 each set of dual conductive layers are arranged in 90 degree orientations creating a mesh of metal strips above and below the solenoid coil (not shown in FIG. 10).

More specifically, first dual conductive layer 1005 has a first layer 1015a with first strips 1120 of electrically conductive material arranged in a front-back orientation (as shown in FIG. 10) and a second conducive layer 1015b has second strips 1125 arranged in a left-right orientation (as shown in FIG. 10). Second dual conductive layer 1010 has a third layer 1015c with third strips 1130 of electrically conductive material arranged in a front-back orientation (as shown in FIG. 10) and a fourth conducive layer 1015d has fourth strips 1135 arranged in a left-right orientation (as shown in FIG. 10).

In some embodiments first and second dual conductive layers 1005, 1010, respectively can be coupled to a ground potential and act as electromagnetic interference shields that attenuate electromagnetic noise generated by inductive device 1000. In further embodiments first and second dual conductive layers 1005, 1010, respectively, can be left electrically floating and/or are coupled to a different voltage potential than ground.

In some embodiments a width of the conductive strips and/or gaps there between can be optimized to balance attenuation of electromagnetic noise generated by inductive device 1000 with the losses in the inductive device associated with the proximity of first and second dual conductive layers to the inductive device.

Figure 11:
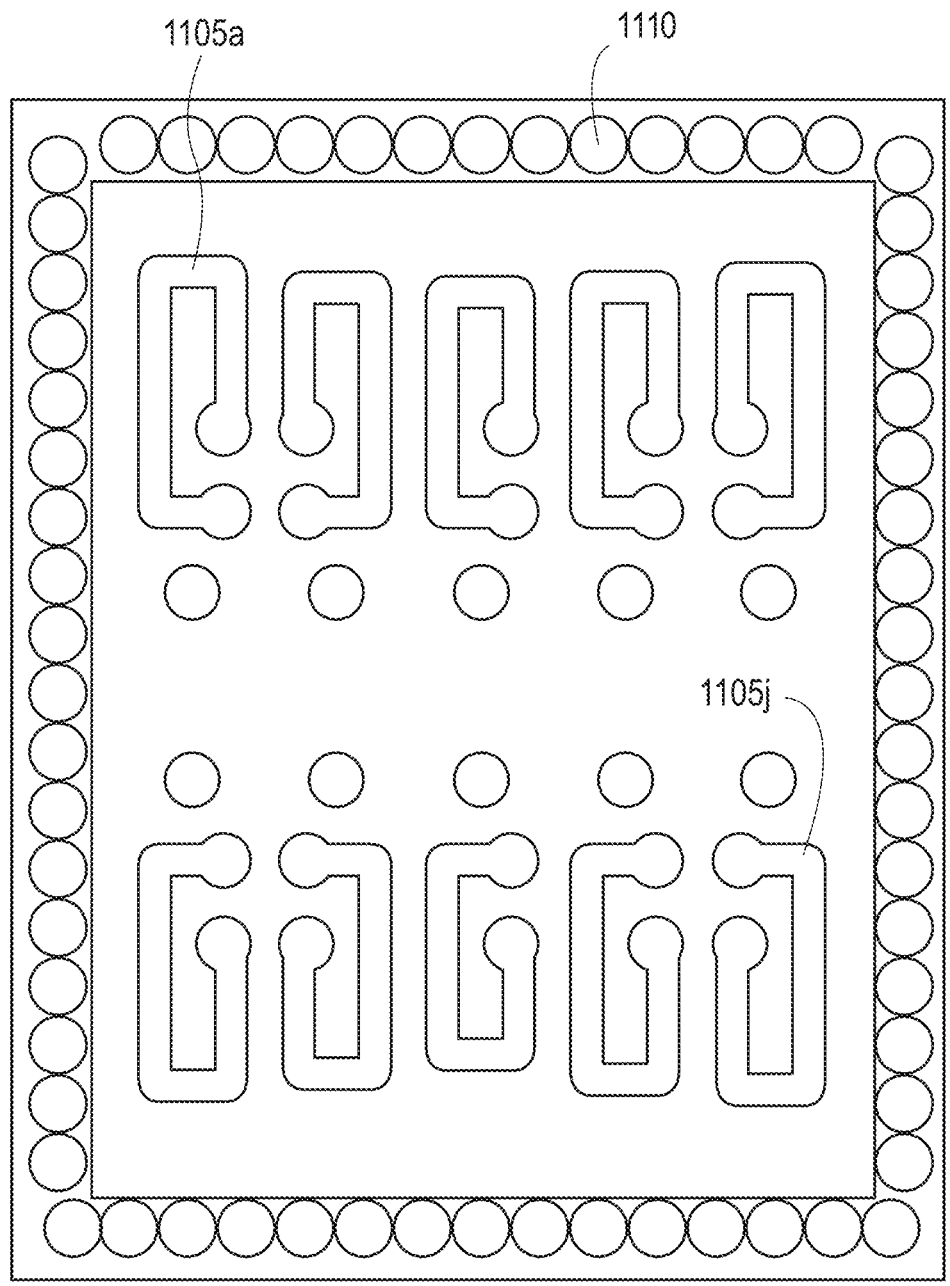
FIG. 11 illustrates a group of inductive devices that are enclosed by a row of vias, according to embodiments of the disclosure.

FIG. 11 illustrates a group of inductive devices that are enclosed by a row of vias, according to embodiments of the disclosure. As shown in FIG. 11, a plurality of inductive devices 1105a-1105j, illustrated as solenoid devices but can be any inductive device, are enclosed by a continuous row of vias 1110. In some embodiments vias 1110 can be coupled to ground and used as an EMI shield to reduce electromagnetic noise emitted from inductive devices 1105a-1105j. In further embodiments row of vias 1110 can be used in conjunction with first and second electrically conductive layers as shown in FIGS. 8-10 to enclose inductive devices 1105a-1105j on a top side, a bottom side and around a periphery to further reduce electromagnetic interference.

Figure 12:
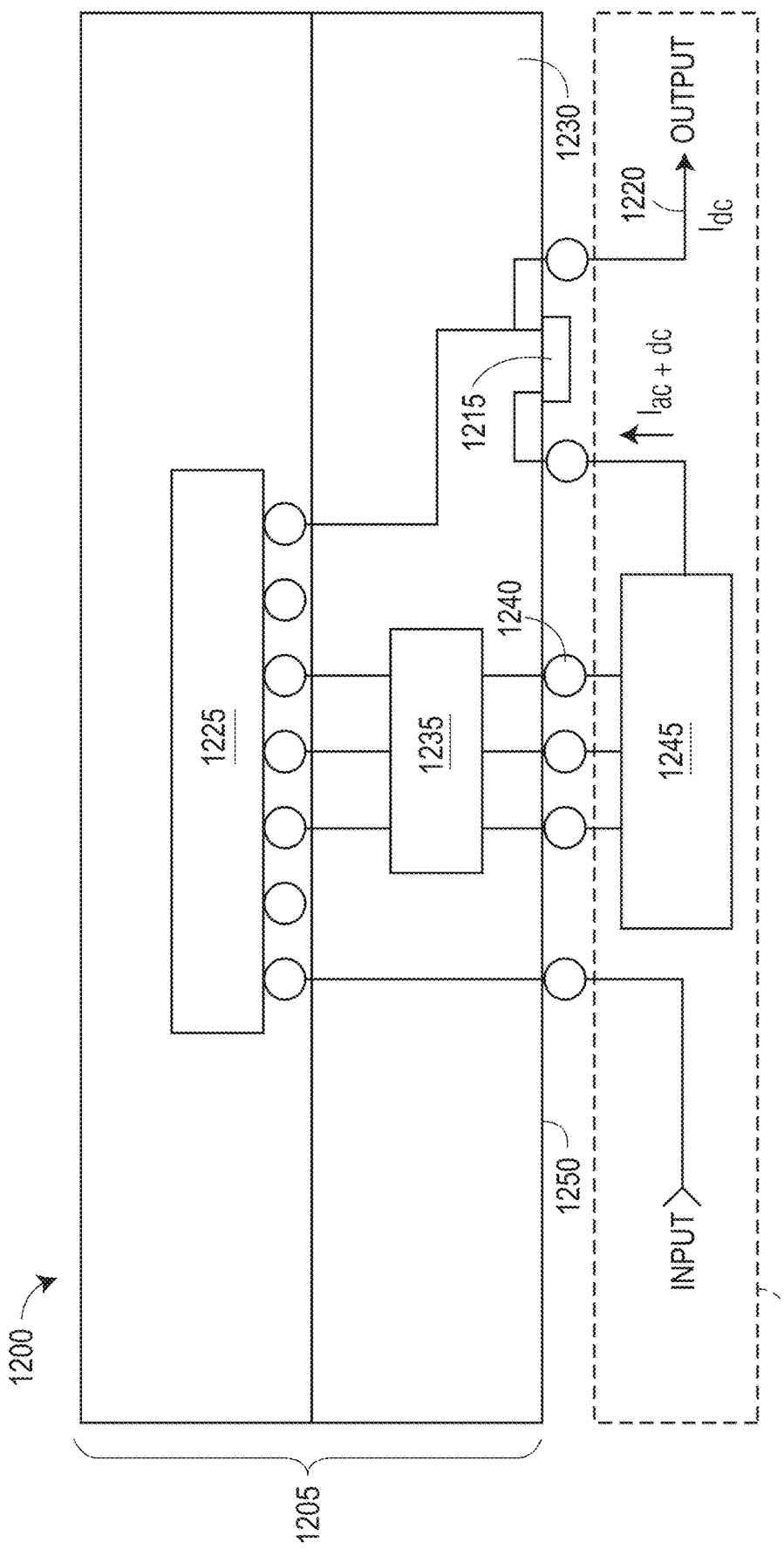
FIG. 12 illustrates a simplified cross-sectional view of an electronic assembly, according to embodiments of the disclosure.

FIG. 12 illustrates a simplified cross-sectional view of an electronic assembly, according to embodiments of the disclosure. As shown in FIG. 12, electronic assembly 1200 is similar to electronic assembly electronic assembly 100 shown in FIG. 1, however, in this embodiment electronic package 1205 includes one or more output capacitors 1215 coupled to power output signal 1220, as described in more detail below.

As shown in FIG. 12, power output signal 1220 exits IC 1225 and enters substrate 1230. Within substrate 1230 power output signal 1220 is transferred through one or more first inductive devices 1235 then exits package through spheres 1240. Power output signal 1220 then enters PCB 1210 and is transferred through one or more second inductive devices 1245 that are embedded within PCB. PCB 1210 then couples power output signal 1220 back into the substrate where the signal is transferred across one or more output capacitors 1215 that can be attached to a bottom surface 1250 of substrate 1230. After passing across one or more output capacitors 1215 the power output signal 1220 can be coupled back into PCB 1210 and transmitted to the load (not shown in FIG. 12).

After one or more output capacitors 1215 an AC component of power output signal 1220 may be reduced such that the power output signal consists of predominantly a DC component of the signal. A combination of first and second inductive devices 1235, 1245, respectively, and one or more output capacitors 1215 attenuate ripple on power output signal 1220. In some embodiments one or more of first inductive devices 1235 may be one or more parallel or series inductive devices. Similarly, one or more of second inductive devices 1245 may be one or more parallel or series inductive devices.

Figure 13:
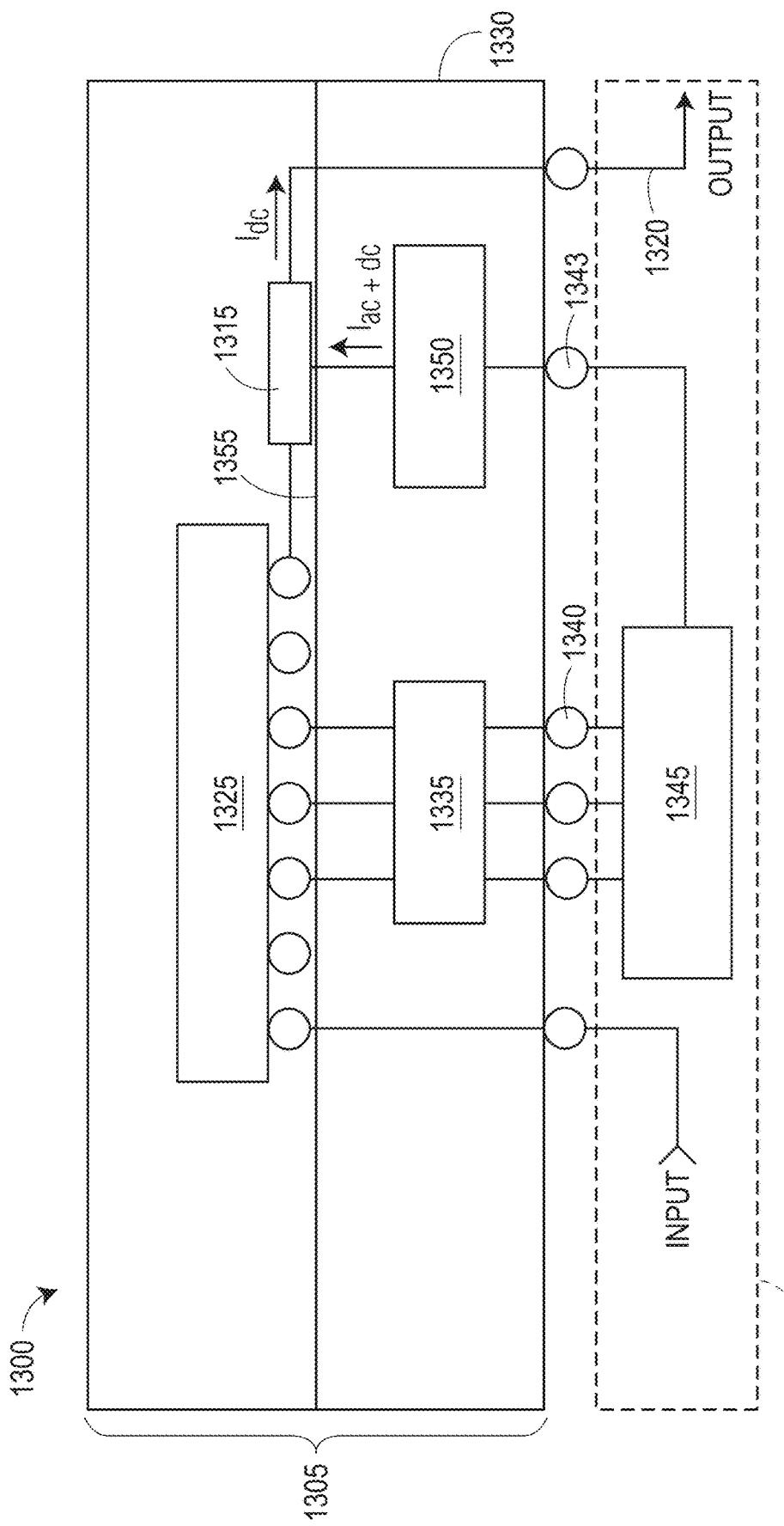
FIG. 13 illustrates a simplified cross-sectional view of an electronic assembly, according to embodiments of the disclosure.

FIG. 13 illustrates a simplified cross-sectional view of an electronic assembly, according to embodiments of the disclosure. As shown in FIG. 13, electronic assembly 1300 is similar to electronic assembly 1200 shown in FIG. 1, however in this embodiment the one or more output capacitors 1315 are attached to a top surface 1355 of substrate 1330 and a third inductive device 1350 is formed in substrate 1330. As shown in FIG. 13, power output signal 1320 exits IC 1325 and enters substrate 1330. Within substrate 1330 power output signal 1320 is transferred through one or more first inductive devices 1335 then exits package 1305 through spheres 1340. Power output signal 1320 then enters PCB 1310 and is transferred through one or more second inductive devices 1345 that are embedded within the PCB. PCB 1310 then couples power output signal 1320 back into substrate 1330 where the signal is transferred through one or more third inductive devices 1350 embedded in the substrate. Substrate 1330 couples power output signal 1320 to one or more output capacitors 1315 attached to a top surface 1355 of substrate 1330, adjacent IC 1325.

One or more output capacitors 1315 attenuate the AC component of the output power signal 1320 such that a predominant DC component of the power output signal can be transferred through the substrate, into the PCB and out to the load (now shown in FIG. 13). A combination of first, second, third inductive devices 1335, 1345, 1350, respectively, and one or more output capacitors 1315 attenuate ripple on power output signal 1320 such that the signal can be delivered to a load. In some embodiments the one or more first inductive devices 1335 can be one or more parallel or series inductive devices. Similarly, one or more second and one or more third inductive devices 1345, 1350, respectively, may also be one or more parallel or series inductive devices. In some embodiments a location of the output capacitor can be selected in part based on the effects on the equivalent series inductance (ESL) effects of different locations.

In further embodiments, instead of power output signal 1320 coming from capacitor 1315, power output signal 1320 can come from ball 1343, through inductor 1350. This arrangement can reduce DC losses inside package 1305 such that the AC component of the power output signal only goes through inductor 1350 and remains outside of package 1305.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. An electronic package comprising:
   an integrated circuit (IC) configured to receive a power input signal and to deliver a regulated power output signal;
   a multilayer electrical routing structure attached to the IC and configured to couple the electronic package to an external circuit, the multilayer electrical routing structure having one or more electrical conductors on each of at least two layers configured to route the power input signal from the external circuit to the IC and to route the regulated power output signal from the IC to the external circuit, wherein the one or more electrical conductors form an integrated inductive device having a first portion of a turn formed on a first layer of the at least two layers and a second portion of the turn formed on a second layer of the at least two layers, wherein the first portion is connected in series to the second portion through one or more vias, wherein a central axis of the integrated inductive device is oriented perpendicular to the at least two layers and wherein the power output signal is coupled to the external circuit through the integrated inductive device; and
   an encapsulant formed over the IC and at least a portion of the multilayer electrical routing structure.

2. The electronic package of claim 1 wherein the integrated inductive device is in a geometric shape of a solenoid coil.

3. The electronic package of claim 1 wherein each of the first portion and the second portion are each one-half of a turn or greater.

4. The electronic package of claim 1 wherein a first layer of the at least two layers is adjacent a second layer of the at least two layers, wherein the first portion is formed on the first layer and the second portion is formed on the second layer the second winding on a second layer and wherein the at least two layers further include a top layer and a bottom layer between which are positioned the first layer and the second layer, and wherein each of the top layer and the bottom layer include an electrically conductive continuous sheet positioned across a region of the first and the second portions.

5. The electronic package of claim 1 wherein a first layer of the at least two layers is adjacent a second layer of the at least two layers, wherein the first portion is formed on the first layer and the second portion is formed on the second layer, wherein the at least two layers further include a top layer and a bottom layer between which are positioned the first layer and the second layer, and wherein each of the top layer and the bottom layer include sequential strips of electrically conductive material having a respective gap in-between each adjacent strip.

6. The electronic package of claim 1 wherein a first layer of the at least two layers is adjacent a second layer of the at least two layers, wherein the first portion is formed on the first layer and the second portion is formed on the second layer, wherein the at least two layers further include a top layer and a bottom layer between which are positioned the first layer and the second layer, and wherein each of the top layer and the bottom layer include sequential first strips of electrically conductive material extending in a first direction and having a respective gap in-between each adjacent first strip, wherein each of the top layer and the bottom layer further include sequential second strips of electrically conductive material extending in a second direction and having a respective gap in-between each adjacent second strip, and wherein the first direction is orthogonal to the second direction.

7. The electronic package of claim 1 wherein the first and second portions form a vertical solenoid coil arranged to conduct current in a clockwise direction, and wherein the electronic package includes an adjacent vertical solenoid coil arranged to conduct current in a counterclockwise direction.

8. The electronic package of claim 1 further comprising a plurality of adjacent electrically conductive vias that extend from at least the first layer to the second layer and are arranged in a pattern that at least partially encircles the first and second portions.

9. The electronic package of claim 1 wherein the integrated inductive device includes a third layer and a fourth layer, between which the first and second layers are positioned and wherein the third layer and the fourth layer each include sequential strips of electrically conductive material having a respective gap in-between each adjacent strip, wherein the sequential strips are positioned to shield electromagnetic energy generated by the inductive device.

10. An electronic package comprising:
   a substrate including a plurality of layers positioned between a top surface and a bottom surface, the bottom surface including one or more electrical contacts arranged to be electrically coupled to an external circuit; and
   an inductor in a geometric shape of a solenoid coil having one or more turns, the solenoid coil formed within the substrate such that at least a first portion of a first turn is formed on a first layer of the plurality of layers and at least a second portion of the first turn is formed on a second layer of the plurality of layers, wherein the first portion is connected in series to the second portion through one or more vias and wherein a central axis of the solenoid coil is oriented perpendicular to the top surface of the substrate.

11. The electronic package of claim 10 wherein the first layer and the second layer are positioned between an upper layer and a lower layer, and wherein the upper layer and the lower layer each include an electrically conductive continuous sheet extending across the first portion of the first turn and the second portion of the first turn such that the inductor is substantially positioned between the continuous sheets.

12. The electronic package of claim 10 wherein the first layer and the second layer are positioned between an upper layer and a lower layer, and wherein the upper layer and the lower layer each include a shielding region having sequential strips of electrically conductive material having a respective gap in-between each adjacent strip wherein each shielding region extends across a region of the first portion of the first turn and the second portion of the first turn such that the inductor is substantially positioned between the shielding regions.

13. The electronic package of claim 10 further comprising one or more capacitors coupled to the one or more electrical contacts.

14. The electronic package of claim 10 further comprising a plurality of adjacent electrically conductive vias that extend from the first layer to the second layer and are arranged in a pattern that at least partially encompasses the solenoid coil.

* * * * *